US012805139B2

(12) United States Patent
Zhang

(10) Patent No.: US 12,805,139 B2
(45) Date of Patent: Nov. 17, 2026

(54) DISPLAY PANEL

(71) Applicant: Shenzhen China Star Optoelectronics Semiconductor Display Technology Co., Ltd., Shenzhen (CN)

(72) Inventor: Qianyi Zhang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 371 days.

(21) Appl. No.: 18/542,683

(22) Filed: Dec. 17, 2023

(65) Prior Publication Data

US 2024/0349561 A1 Oct. 17, 2024

(30) Foreign Application Priority Data

Apr. 13, 2023 (CN) ......................... 202310442455.8

(51) Int. Cl.
*H10K 59/131* (2023.01)
*H10K 59/80* (2023.01)
*H10K 102/00* (2023.01)

(52) U.S. Cl.
CPC ....... *H10K 59/1315* (2023.02); *H10K 59/873* (2023.02); *H10K 2102/351* (2023.02)

(58) Field of Classification Search
None
See application file for complete search history.

(56) References Cited

U.S. PATENT DOCUMENTS

2016/0043341 A1* 2/2016 Heo .................... H10K 59/1315 438/23
2023/0189572 A1* 6/2023 Lee .................... H10K 59/1315 257/40

* cited by examiner

*Primary Examiner* — Jay C Chang
(74) *Attorney, Agent, or Firm* — PV IP PC; Peter Stecher; Wei Te Chung

(57) ABSTRACT

A display panel includes an array substrate, a passivation layer, a flat layer, a second electrode layer, and a luminescent functional layer. The array substrate includes a first electrode layer. A first hole is defined in the passivation layer. A second hole is defined in the flat layer. A third hole is defined in the second electrode layer. The luminescent functional layer includes a luminescent layer, a cathode layer, and an anode layer connected to the first electrode layer. A projection area of the first hole on the array substrate is greater than a projection area of the second hole on the array substrate. The first electrode layer is located at a bottom of the first hole. The cathode layer is connected to the second electrode layer through the third hole, and connected to the first electrode layer through the second hole and the first hole.

20 Claims, 6 Drawing Sheets

DISPLAY PANEL

CROSS REFERENCE TO RELATED APPLICATION

This application claims priority to Chinese Application No. 202310442455.8, filed on Apr. 13, 2023. The entire disclosure of the above applications is incorporated herein by reference.

FIELD OF THE DISCLOSURE

The present disclosure relates to the field of display technology, more particularly, to a display panel.

BACKGROUND

Organic Light-Emitting Diode (OLED) display panels are increasingly being used due to their advantages such as low cost, high luminous efficiency, easy formation of flexible structures, low power consumption, high color saturation, and wide viewing angle.

At present, cathodes of OLED display panels are generally made of a thin layer of conductive metal with high impedance, resulting in a large voltage drop (IR drop) and a significant difference between an actual driving voltage of the OLED array substrate and a power supply voltage. For the OLED display devices, the brightness of the large area is uneven, which affects the display effect.

SUMMARY

Based on the shortcomings and defects in the existing technologies mentioned above, the purpose of the present disclosure is to provide a display panel that can alleviate the problem of uneven display brightness caused by high cathode layer impedance.

The present disclosure provides a display panel. The display panel includes an array substrate, a passivation layer located on the array substrate, a flat layer located on the passivation layer, a second electrode layer located on the flat layer, and a luminescent functional layer located on an area of the second electrode layer corresponding to a display area that is around the display area. The array substrate includes a first electrode layer. A first hole corresponding to a resistance improvement area is defined in the passivation layer. A second hole corresponding to the resistance improvement area is defined in the flat layer. A third hole corresponding to the resistance improvement area is defined in the second electrode layer. The luminescent functional layer includes a luminescent layer, a cathode layer, and an anode layer connected to the first electrode layer on the display area. The first hole, the second hole, and the third hole are connected, and a projection area of the first hole on the array substrate is greater than a projection area of the second hole on the array substrate. A portion of the first electrode layer on the resistance improvement area is located at a bottom of the first hole. The cathode layer is connected to the second electrode layer through the third hole, and connected to the first electrode layer on the resistance improvement area through the second hole and the first hole.

Optionally, a projection area of the second hole on the array substrate is greater than a projection area of the third hole on the array substrate.

Optionally, a concave notch on a side of the third hole is formed on the second electrode layer, and the cathode layer is connected to the second electrode layer through the concave notch.

Optionally, the display panel further includes a substrate, a third electrode layer located on the substrate, and a dielectric layer located on the third electrode layer. The first electrode layer is located on the dielectric layer, and the first electrode layer located in the resistance improvement area is parallel to the third electrode layer.

Optionally, the display panel further includes a capacitance area located around the display area. The first electrode layer and the second electrode layer located in the capacitance area form an auxiliary capacitor.

Optionally, the first electrode layer located in the capacitor area is in parallel with the third electrode layer.

Optionally, the display panel further includes a packaging area located on a side of the resistance improvement area far from the display area, and no flat layer is formed on the packaging area.

Optionally, the flat layer is not formed on a junction of the resistance improvement area and the display area.

Optionally, the anode layer comprises a first anode layer and a second anode layer. The first anode layer is located on the second electrode layer. The second anode layer is located on the first anode layer. The luminescent layer is located on the second anode layer, and the first anode layer is electrically connected to the first electrode layer.

Optionally, a thickness of the second electrode layer ranges from 50 Å to 200 Å.

The present disclosure also provides a display panel. The display panel includes an array substrate, a passivation layer located on the array substrate, a flat layer located on the passivation layer, a second electrode layer located on the flat layer, and a luminescent functional layer located on an area of the second electrode layer corresponding to a display area that is around the display area. The array substrate includes a first electrode layer. A first hole corresponding to a resistance improvement area is defined in the passivation layer. A second hole corresponding to the resistance improvement area is defined in the flat layer. A third hole corresponding to the resistance improvement area is defined in the second electrode layer and a concave notch on a side of the third hole is formed on the second electrode layer. The luminescent functional layer comprising a luminescent layer, a cathode layer, and an anode layer connected to the first electrode layer on the display area. The cathode layer is connected to the first electrode layer on the resistance improvement area through the second hole and the first hole. The cathode layer is connected to the second electrode layer through the third hole and the concave notch.

Optionally, a projection area of the second hole on the array substrate is greater than a projection area of the third hole on the array substrate.

Optionally, a projection area of the first hole on the array substrate is greater than a projection area of the second hole on the array substrate.

Optionally, the display panel further includes a substrate, a third electrode layer located on the substrate, and a dielectric layer located on the third electrode layer. The first electrode layer is located on the dielectric layer, and the first electrode layer located in the resistance improvement area is parallel to the third electrode layer.

Optionally, the display panel further includes a capacitance area located around the display area. The first electrode layer and the second electrode layer located in the capacitance area form an auxiliary capacitor.

Optionally, the first electrode layer located in the capacitor area is in parallel with the third electrode layer.

Optionally, the display panel further includes a packaging area located on a side of the resistance improvement area far from the display area, and no flat layer is formed on the packaging area.

Optionally, the flat layer is not formed on a junction of the resistance improvement area and the display area.

Optionally, the anode layer comprises a first anode layer and a second anode layer. The first anode layer is located on the second electrode layer. The second anode layer is located on the first anode layer. The luminescent layer is located on the second anode layer, and the first anode layer is electrically connected to the first electrode layer.

Optionally, a thickness of the second electrode layer ranges from 50 Å to 200 Å.

Compared with the prior art, the display panel includes an array substrate, a passivation layer located on the array substrate, a flat layer located on the passivation layer, a second electrode layer located on the flat layer, and a luminescent functional layer located on an area of the second electrode layer corresponding to a display area that is around the display area. The array substrate includes a first electrode layer. A first hole corresponding to a resistance improvement area is defined in the passivation layer. A second hole corresponding to the resistance improvement area is defined in the flat layer. A third hole corresponding to the resistance improvement area is defined in the second electrode layer. The luminescent functional layer includes a luminescent layer, a cathode layer, and an anode layer connected to the first electrode layer on the display area. The first hole, the second hole, and the third hole are connected, and a projection area of the first hole on the array substrate is greater than a projection area of the second hole on the array substrate. A portion of the first electrode layer on the resistance improvement area is located at a bottom of the first hole. The cathode layer is connected to the second electrode layer through the third hole, and connected to the first electrode layer on the resistance improvement area through the second hole and the first hole. the present disclosure comprises an undercut structure comprising a first hole, a second hole, and a third hole in the resistance improvement area, allowing the cathode layer to be filled into the undercut structure during film formation. In the undercut structure, the cathode layer is connected in parallel with the first and second electrode layers, thereby reducing the impedance of the cathode layer, preventing significant voltage drop (IR drop), and alleviating the problem of uneven display brightness caused by high impedance of the cathode layer.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DESCRIPTION OF THE EMBODIMENTS

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

All of the terminologies containing one or more technical or scientific terminologies have the same meanings that persons skilled in the art understand ordinarily unless they are not defined otherwise. For example, "arrange," "couple," and "connect," should be understood generally in the embodiments of the present disclosure. For example, "firmly connect," "detachably connect," and "integrally connect" are all possible. It is also possible that "mechanically connect," "electrically connect," and "mutually communicate" are used. It is also possible that "directly couple," "indirectly couple via a medium," and "two components mutually interact" are used.

The term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

Figure 1:
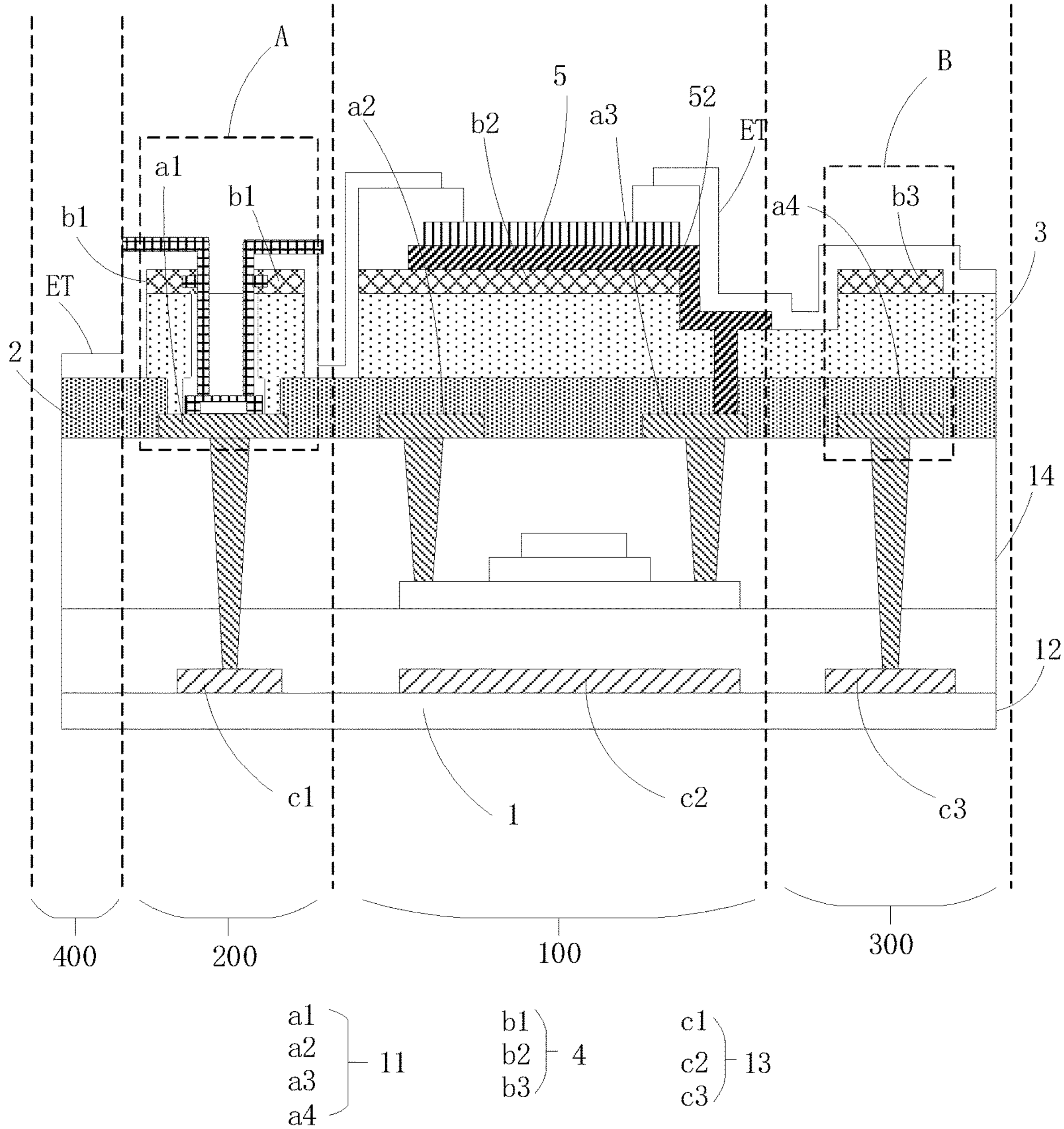
FIG. 1 is a schematic diagram of a display panel according to one embodiment of the present disclosure.
Figure 2:
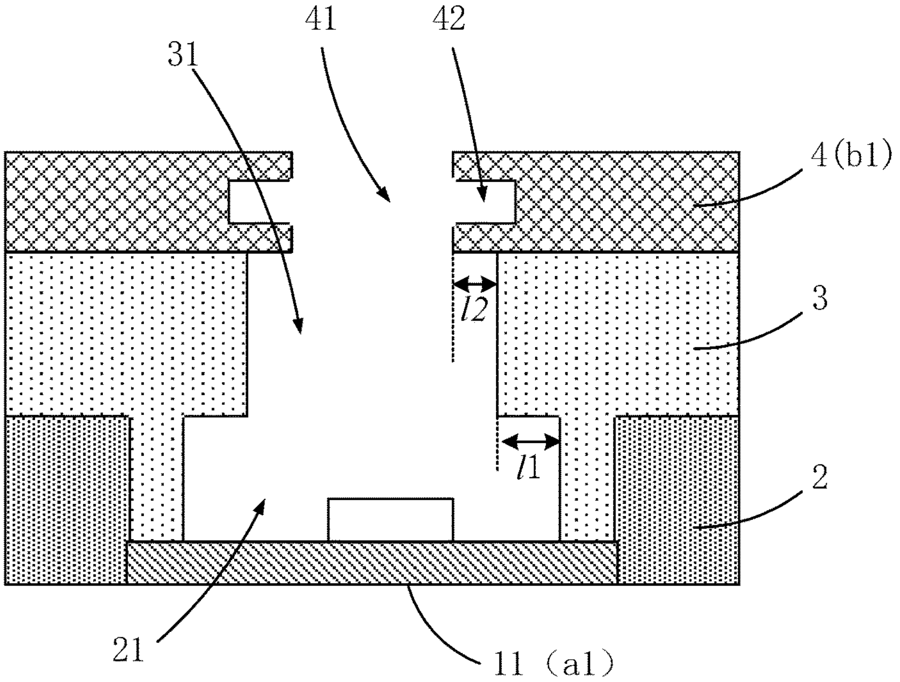
FIG. 2 is an enlarged schematic diagram of a undercut structure according to one embodiment of the present disclosure.
Figure 3:
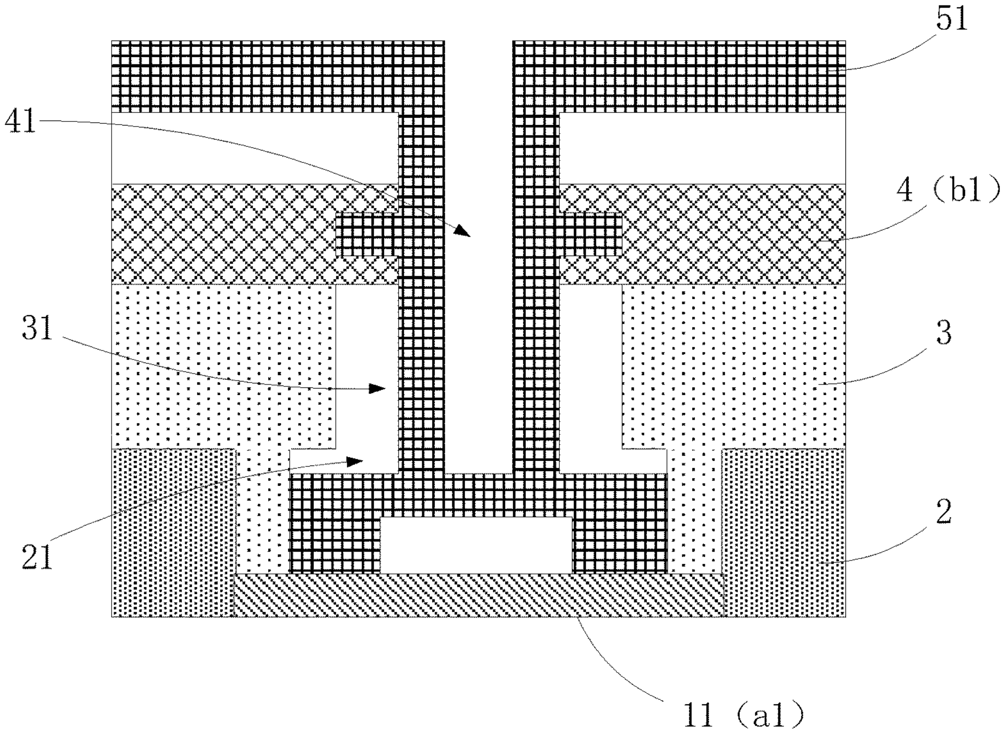
FIG. 3 is an enlarged schematic diagram of the undercut structure according to another embodiment of the present disclosure.

An embodiment of the present disclosure is directed a display panel, as shown in FIGS. 1 to 3, which comprises a display area 100 and a resistance improvement area 200 located around the display area 100. The display panel also comprises an array substrate 1, a passivation layer 2, a flat layer 3, a second electrode layer 4, and a luminescent functional layer 5. The array substrate 1 comprises a first electrode layer 11. The passivation layer 2 is located on the array substrate 1 and a first hole 21 is formed in the resistance improvement area 200. The flat layer 3 is located on the passivation layer 2, and a second hole 31 is formed in the resistance improvement area 200. The second electrode layer 4 is located on the flat layer 3, and a third hole 41 is formed in the resistance improvement area 200. The luminescent functional layer 5 is located on the second electrode layer 4 of the display area 100, which comprises a luminescent layer (not shown in the figure), a cathode layer 51, and an anode layer 52. The anode layer 52 is connected to the first electrode layer 11 on the display area 100.

As illustrated in FIG. 2, the first hole 21, the second hole 31, and the third hole 41 are connected. A projection area of the first hole 21 on the array substrate 1 is greater than a projection area of the second hole 31 on the array substrate 1. At least a portion of the first electrode layer 11 on the resistance improvement area 200 is located at a bottom of the first hole 21. As shown in FIG. 3, the cathode layer 51 is connected to the second electrode layer 4 through a third hole 41, and to the first electrode layer 11 on the resistance improvement area 200 is connected through a second hole 31 and a first hole 21.

Based on the above structure, the embodiment of the present disclosure is directed to the resistance improvement area 200, which is composed of a undercut structure A having a first hole 21, a second hole 31, and a third hole 41, so that the cathode layer 51 can be filled to the undercut structure A during a film forming process. As shown in FIG. 3, in the undercut structure A, the cathode layer 51 is connected in parallel with the first electrode layer 11 and the second electrode layer 4, thereby reducing a impedance of the cathode layer 51, preventing a significant voltage drop, and alleviating the problem of uneven display brightness caused by a high impedance of the cathode layer 51.

On the other hand, in the current production process of OLED display panels, the flat layer 3 and the passivation layer 2 generally share a mask, which can easily cause foreign objects to remain on a surface of the flat layer 3 after ashing, causing the surface of the flat layer 3 to protrude, thereby affecting the luminescent layer 5 located on the flat layer 3, causing poor dark spots on the display panel.

In response to the above situation, this embodiment sets a second electrode layer 4 on the flat layer 3, which can make the electrode layer cover the protruding foreign objects on the flat layer 3, and the luminescent functional layer 5 is directly connected to the second electrode layer 4 to avoid the protruding foreign objects on the flat layer 3 causing dark spots.

In another embodiment, a projection area of the second hole 31 on the array substrate 1 is greater than a projection area of the third hole 41 on the array substrate 1. In this way, the undercutting structure A can be further formed through the first hole 21, the second hole 31, and the third hole 41.

When evaporating a electron injection layer ET on the second electrode layer 4 and the luminescent functional layer 5, the electron injection layer ET can be disconnected at the undercut structure A, and then a cathode layer 51 can be formed on the electron injection layer to fill the undercut structure A and connect with the first electrode layer 11 and the second electrode layer 4.

Specifically, in the undercut structure A, as shown in FIG. 2, the flat layer 3 and the passivation layer 2 form a first brim at the connection disposed between the first hole 21 and the second hole 31, with a length 11 of 0.6 microns to 1.2 microns. The second electrode layer 4 and the flat layer 3 form a second brim at the connection disposed between the second hole 31 and the third hole 41, with a length 12 of 0.4 microns to 0.8 microns.

In another embodiment, the second electrode layer 4 forms a concave notch 42 on the side of the third hole 41, and the cathode layer 51 is connected to the second electrode layer 4 through the concave notch 42. This can make the connection disposed between the cathode layer 51 and the second electrode layer 4 more secure, while increasing a contact area disposed between the cathode layer 51 and the second electrode layer 4, further reducing the impedance of the cathode layer 51.

In another embodiment, the array substrate 1 also comprises a substrate 12, a third electrode layer 13, and a dielectric layer 14. The third electrode layer 13 is located on the substrate 12, the dielectric layer 14 is located on the third electrode layer 13, the first electrode layer 11 is located on the dielectric layer 14, and the first electrode layer 11 located in the resistance improvement area 200 is wired in parallel with the third electrode layer 13. This can further reduce the impedance of the cathode layer 51.

In another embodiment, the display panel also includes a capacitance area 300, which is located around the display area 100. The first electrode layer 11 and the second electrode layer 4 in the capacitance area 300 form an auxiliary capacitor B.

Due to process limitations, the capacitance of an existing array substrate 1 is generally relatively small, which can easily lead to insufficient charging and discharging. This embodiment can enhance the charging and discharging capacity and improve the display effect by auxiliary capacitor B.

In another embodiment, the first electrode layer 11 and the third electrode layer 13 located in the capacitor area 300 are wired in parallel. This can reduce the impedance of the first electrode layer 11 in the capacitor area 300 and improve the charging and discharging capacity of auxiliary capacitor B.

In another embodiment, the display panel also comprises a packaging area 400, which is located on a side of the resistance improvement area 200 away from the display area 100. A flat layer 3 is not formed on the packaging area 400. Due to the fact that the flat layer 3 is mostly made of organic materials and is prone to penetration and invasion by water and oxygen, this embodiment removes the flat layer 3 from the packaging area 400 to enhance its reliability and prevent water and oxygen from invading the interior of the display panel through the flat layer 3, affecting the display efficiency and service life of the display panel.

In another embodiment, the connection disposed between the resistance improvement area 200 and the display area 100 does not form a flat layer 3. This can improve the smoothness of the connection disposed between the resistance improvement area 200 and the display area 100.

Figure 10:
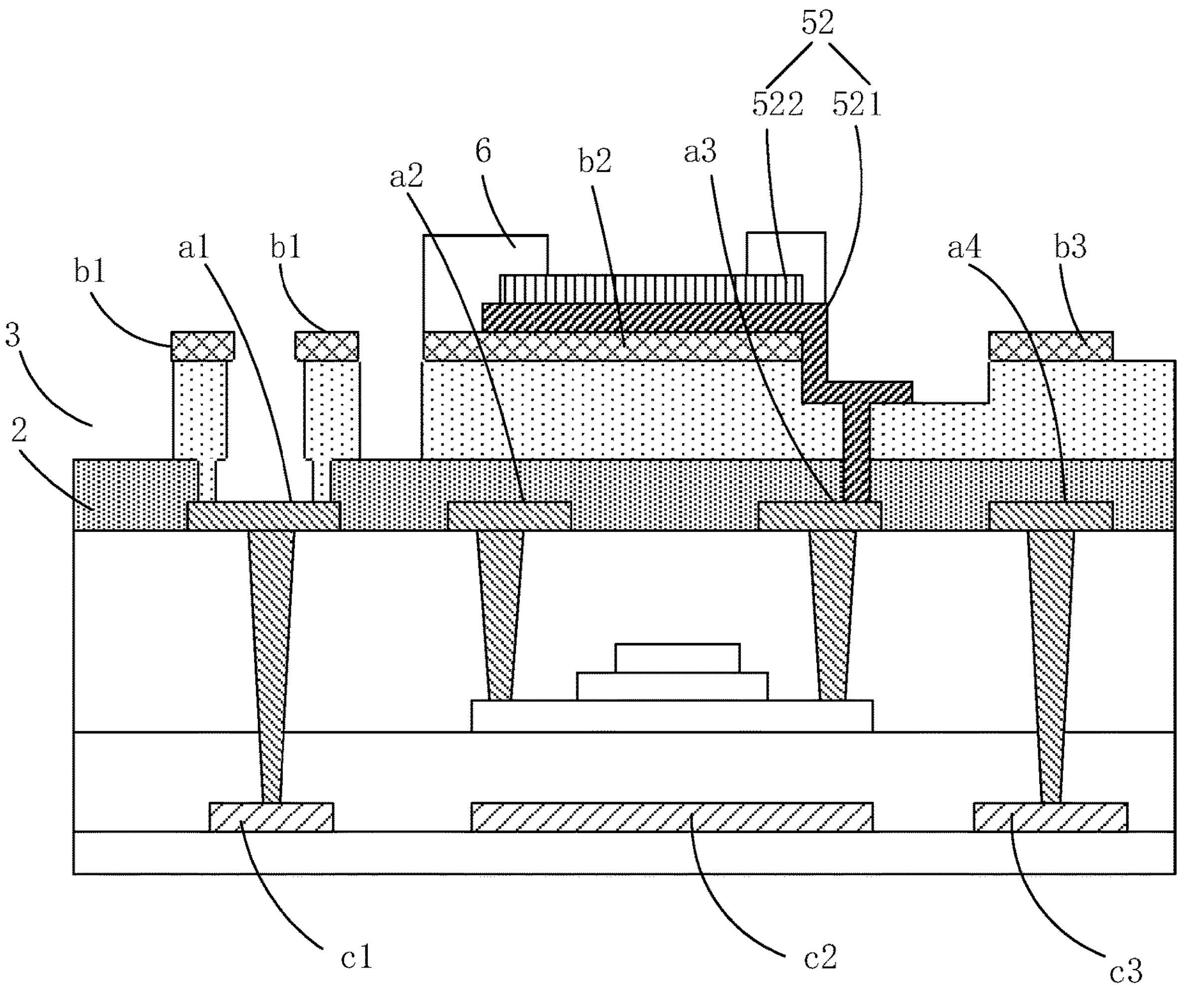
FIG. 10 illustrates a schematic diagram of a manufacturing process of the display panel after the process illustrated in FIG. 8.

In another embodiment, as shown in FIG. 10, the anode layer 52 comprises a first anode layer 521 and a second anode layer 522. The first anode layer 521 is located on the second electrode layer 4, the second anode layer 522 is located on the first anode layer 521, the luminescent layer is located on the second anode layer 522, and the first anode layer 521 is electrically connected to the first electrode layer 11. In this way, the anode layer 52 forms a double-layer structure to reduce the impedance of the anode layer 52 and improve the display luminescence effect. On the other hand, the first anode layer 521 is arranged on the second electrode layer 4, which can further reduce the overall impedance of the anode layer 52.

In another embodiment, a thickness of the second electrode layer 4 ranges from 50 Å to 200 Å. This thickness can ensure that the second electrode layer 4 can fully cover and fill the protruding foreign objects on the flat layer 3. The second electrode layer 4 and cathode layer 51 are both made of transparent conductive materials.

Figure 4:
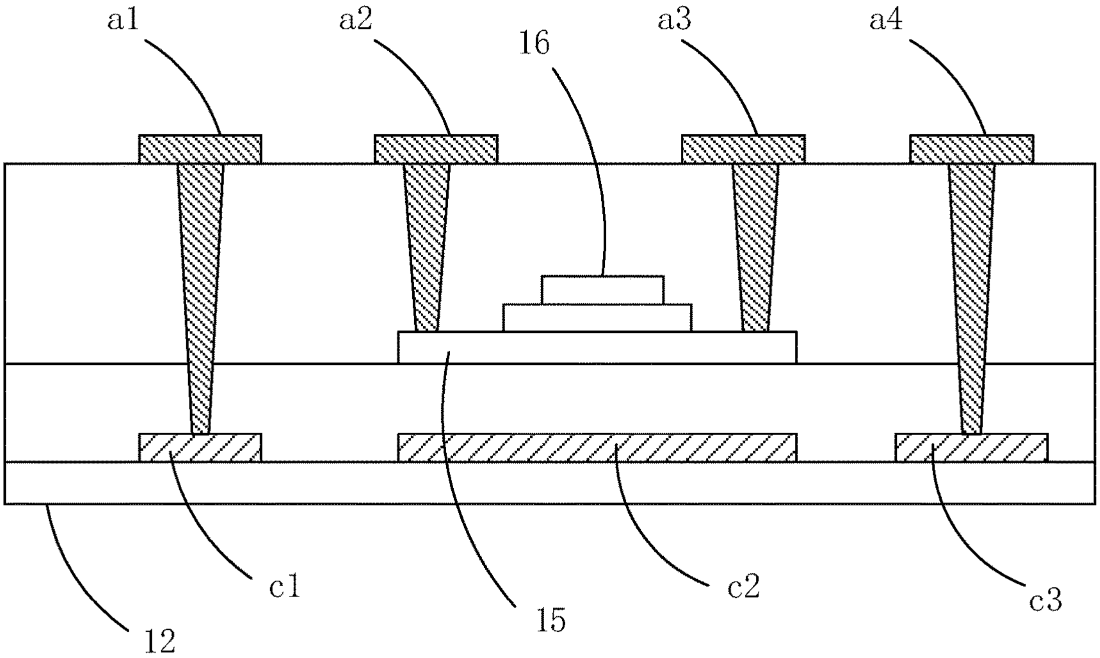
FIG. 4 illustrates a schematic diagram of a manufacturing process of the display panel according to one embodiment of the present disclosure.

The display panel of this embodiment can be made by the following methods:

Step 1: As shown in FIG. 4, a main thin film transistor (TFT) structure and wiring are completed graphically on the substrate 12. The first electrode layer 11 comprises an electrode layer a1, an electrode layer a2, an electrode layer a3, and an electrode layer a4. The third electrode layer 13 comprises an electrode layer c1, an electrode layer c2, and an electrode layer c3. The electrode layer a1 runs in parallel with the electrode layer c1, and the electrode layer a4 runs in parallel with the electrode layer c3 to reduce the wiring impedance; The electrode layer a2 and electrode layer c3 serve as the source and drain electrodes of TFT, respectively connected to the active layer 15. A gate 16 is also formed on the active layer 15, and the electrode layer a4 is an electrode of the auxiliary capacitor B.

Figure 5:
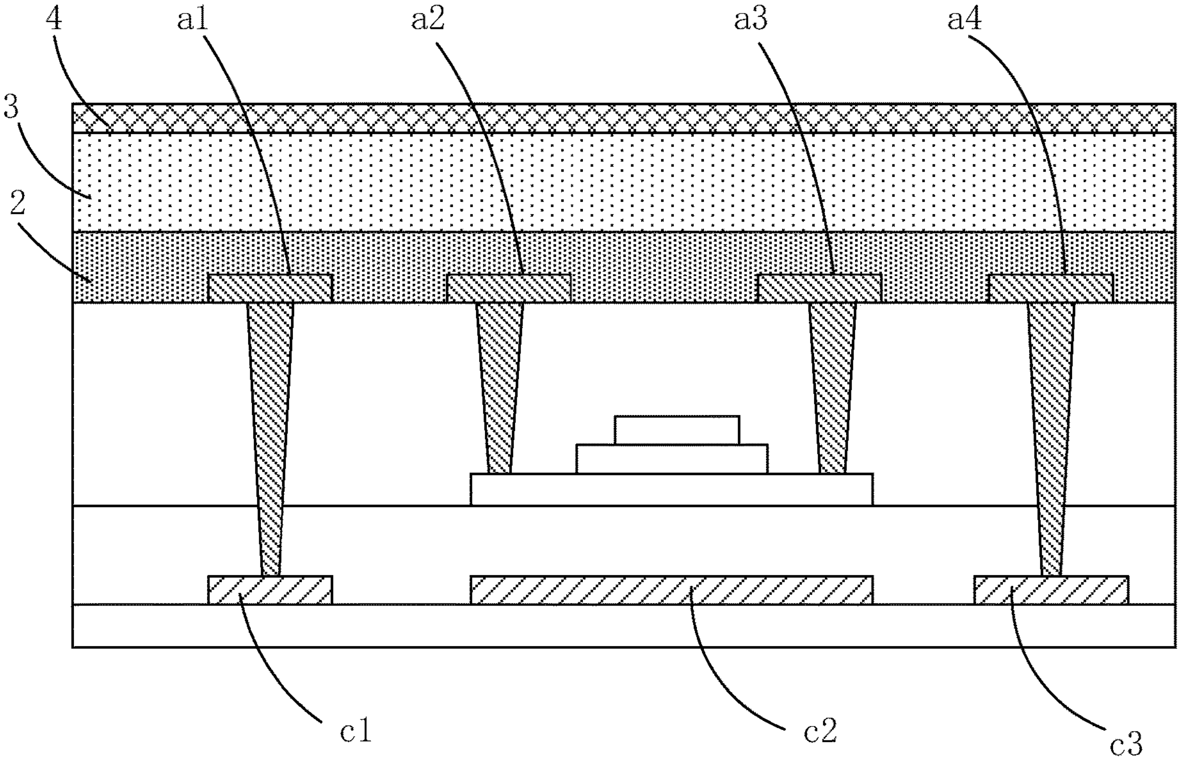
FIG. 5 illustrates a schematic diagram of a manufacturing process of the display panel after the process illustrated in FIG. 4.

Step 2: As shown in FIG. 5, a deposit passivation layer 2, a flat layer 3, and a second electrode layer 4 are formed. The second electrode layer 4 serves as a cushion layer for the anode layer 52 of the luminescent functional layer 5, with a thickness of 50 Å to 200 Å, and a flat layer 3 is made of organic material.

Figure 6:
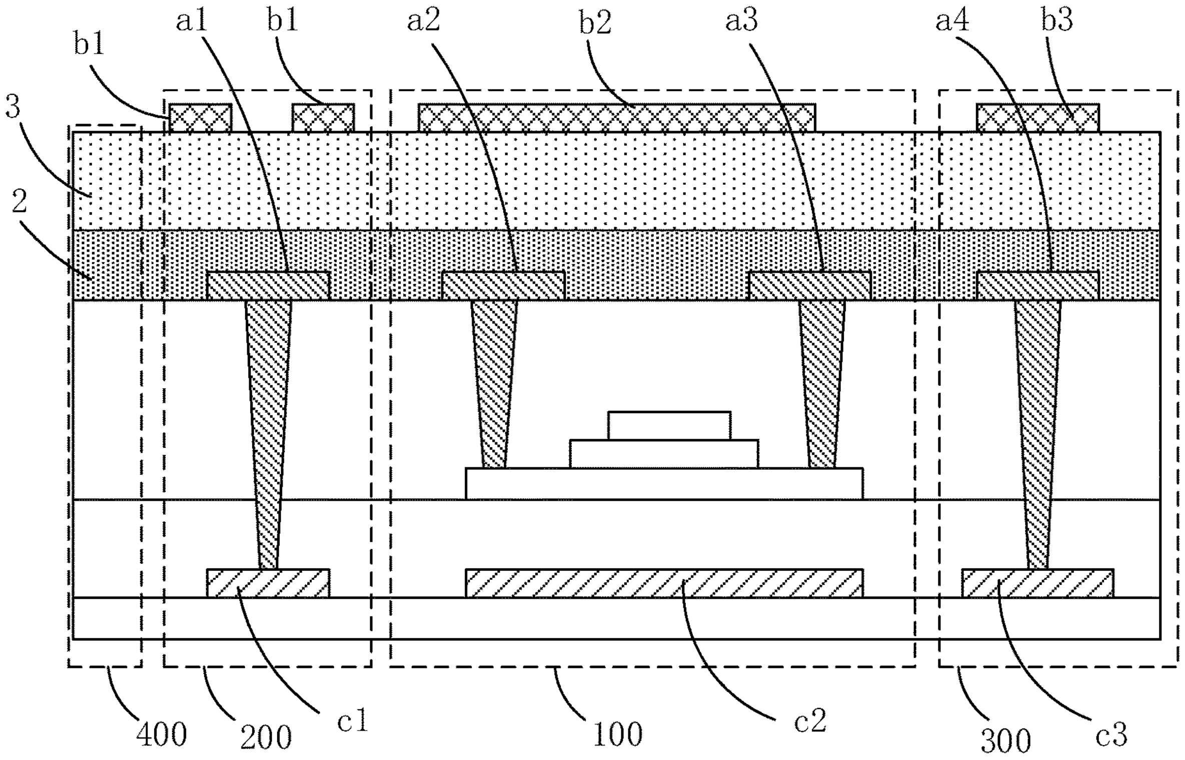
FIG. 6 illustrates a schematic diagram of a manufacturing process of the display panel after the process illustrated in FIG. 5.

Step 3: As shown in FIG. 6, the second electrode layer 4 is patterned and the substrate 12 is divided into four areas, which comprises a packaging area 400, a resistance improvement area 200, a display area 100, and a capacitance area 300. The second electrode layer 4 comprises an electrode layer b1, an electrode layer b2, and an electrode layer b3. The electrode layer a1, the electrode layer b1, and the electrode layer c1 are located in the resistance improvement area 200. The electrode layer a2, the electrode layer a3, the electrode layer b2, and the electrode layer c2 are located in the display area 100. The electrode layer a4, the electrode layer b3, and the electrode layer c3 are located in the capacitance area 300. The packaging area 400 cannot have a flat layer 3, and the resistance improvement area 200 needs to be perforated with a flat layer 3 and a passivation layer 2 to form a first hole 21 and a second hole 31, which are overlapped with the cathode layer 51 of the luminescent functional layer 5. The TFT and the display area 100 need to be flattened, and the surface of the flat layer 3 is protected by a second electrode layer 4 (the electrode layer 22). The electrode layer 14 and the electrode layer 23 of the capacitor area 300 form an auxiliary capacitor.

Figure 7:
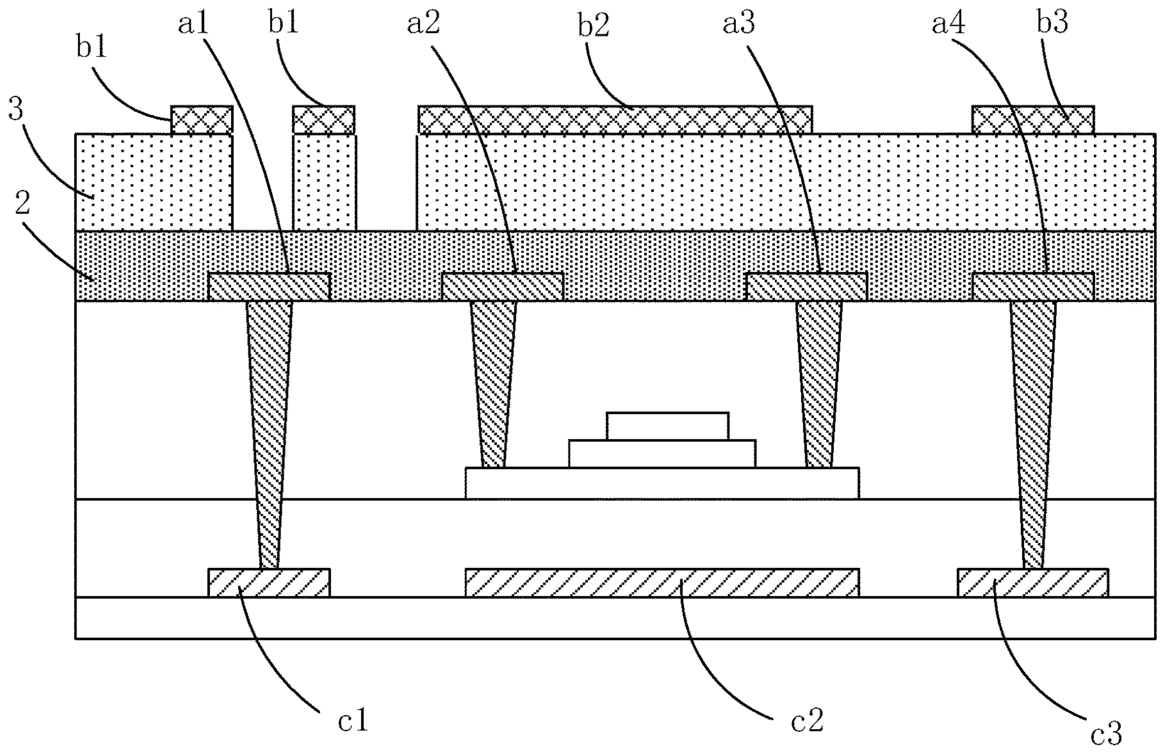
FIG. 7 illustrates a schematic diagram of a manufacturing process of the display panel after the process illustrated in FIG. 6.
Figure 8:
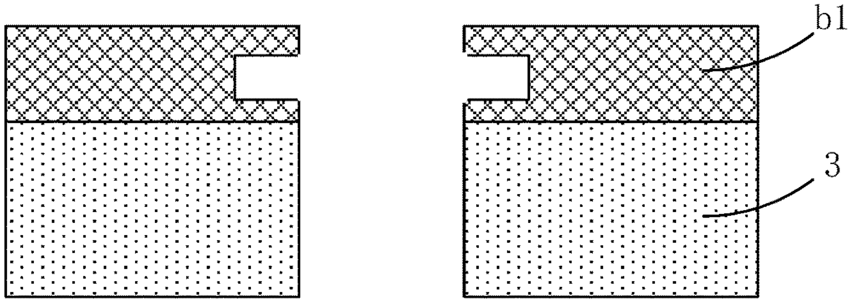
FIG. 8 illustrates a schematic structural diagram of a notch on a side of the second electrode layer according to an embodiment of the present disclosure.

Step 4: As shown in FIG. 7, which performs a photolithography process on the flat layer 3. The flat layer 3 of the packaging area 400 is semitransparent, a reduced flat layer 3 protects the lower passivation layer 2 from etching, and the flat layer 3 of the resistance improvement area 200 is perforated. Then, the passivation layer 2 on the flat layer 3 sleeve is perforated through wet etching. As shown in FIG. 8, a side of the electrode layer b1 is corroded by the etching solution, and is etched into a concave notch shape due to material characteristics. The passivation layer 2 is horizontally etched, with a horizontal distance of more than 1 um from the interface of the flat layer 3.

Figure 9:
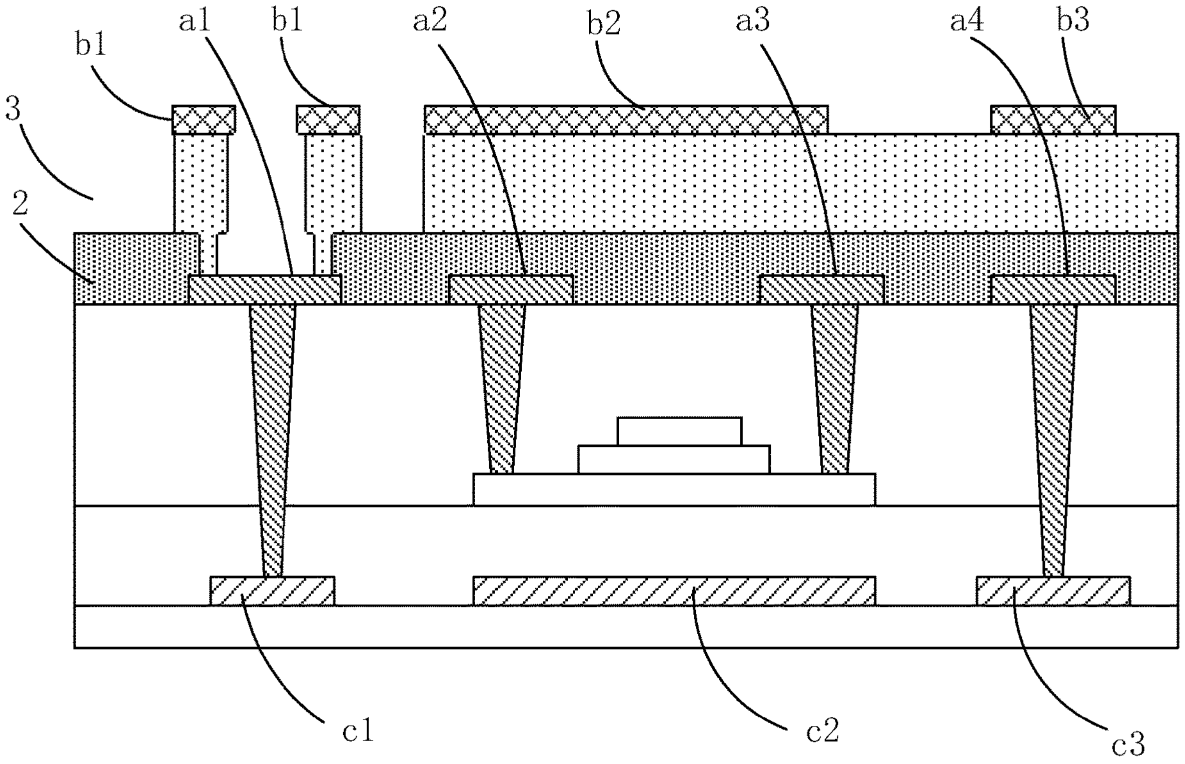
FIG. 9 illustrates a schematic diagram of a manufacturing process of the display panel after the process illustrated in FIG. 7.

Step 5: As shown in FIG. 9, the flat layer 3 with reduced thickness is mainly composed of the packaging area 400 and the interface area disposed between the packaging area 400 and the display area 100. Removing the flat layer 3 from the packaging area 400 avoids abnormal packaging reliability, and removing the flat layer 3 from the interface area enhances the smoothness of the resistance improvement area 200. Cure the flat layer 3 material again, as shown in FIG. 10. At this time, due to the presence of electrode layer b1, the flat layer 3 in the resistance improvement area 200 shrinks, forming a second brim with electrode layer b1. The length of the second brim is 0.4 um to 0.8 um. At this time, the flat layer 3 and the passivation layer 2 also form a first brim with a length of 0.6 um to 1.2 um.

Step 6: As shown in FIG. 10, deposit the first anode layer 521 and second anode layer 522 of the luminescent functional layer 5 above the electrode layer b2, pattern them, and then pattern the pixel definition layer 6.

Step 7: As shown in FIGS. 1 and 3, the organic light emitting layer is an inkjet printer, and then the electron injection layer ET is evaporated. The display area 100 is masked, and the resistance improvement area 200 is broken at the undercut structure A due to the special shape of the undercut structure A. A transparent cathode layer 51 is sputtered into a film, and the fracture of the resistance improvement area 200 is filled with the cathode layer 51. The cathode layer 51 is connected in parallel with the electrode layer b1 and the electrode layer a1, thereby reducing the impedance.

The display panel manufactured by the method as provided in the above embodiment comprises an array substrate 1, a passivation layer 2, a flat layer 3, a second electrode layer 4, and a luminescent functional layer 5. The array substrate 1 comprises a first electrode layer 11. The passivation layer 2 is located on the array substrate 1 and a first hole 21 is formed in the resistance improvement area 200. The flat layer 3 is located on the passivation layer 2, and a second hole 31 is formed in the resistance improvement area 200. The second electrode layer 4 is located on the flat layer 3, and a third hole 41 is formed in the resistance improvement area 200. The luminescent functional layer 5 is located on the second electrode layer 4 of the display area 100, which comprises a luminescent layer (not shown in the figure), a cathode layer 51, and an anode layer 52. The anode layer 52 is connected to the first electrode layer 11 on the display area 100. The first hole 21, the second hole 31, and the third hole 41 are connected. A projection area of the first hole 21 on the array substrate 1 is greater than a projection area of the second hole 31 on the array substrate 1. At least a portion of the first electrode layer 11 on the resistance improvement area 200 is located at a bottom of the first hole 21. As shown in FIG. 3, the cathode layer 51 is connected to the second electrode layer 4 through a third hole 41, and to the first electrode layer 11 on the resistance improvement area 200 is connected through a second hole 31 and a first hole 21. In addition, the projection area of the second hole 31 on the array substrate 1 is greater than the projection area of the third hole 41 on the array substrate 1. The second electrode layer 4 forms a concave notch 42 on the side of the third hole 41, and the cathode layer 51 is connected to the second electrode layer 4 through the notch 42. The array substrate 1 also includes a substrate, a third electrode layer 13, and a dielectric layer 14. The third electrode layer 13 is located on the substrate, the dielectric layer 14 is located on the third electrode layer 13, the first electrode layer 11 is located on the dielectric layer 14, and the first electrode layer 11 located in the resistance improvement area 200 is wired in parallel with the third electrode layer 13. The display panel also includes a capacitor area 300 and a packaging area 400. The capacitor area 300 is located around the display area 100, and the first electrode layer 11 and the second electrode layer 4 in the capacitor area 300 form an auxiliary capacitor B. The first electrode layer 11 and the third electrode layer 13 located in the capacitor area 300 are wired in parallel. The packaging area 400 is located on the side of the resistance improvement area 200 away from the display area 100, and no flat layer 3 is formed on the packaging area 400. The connection disposed between the resistance improvement area 200 and the display area 100 does not form a flat layer 3. The anode layer 52 includes a first anode layer 521 and a second anode layer 522. The first anode layer 521 is located on the second electrode layer 4, the second anode layer 522 is located on the first anode layer 521, the luminescent layer is located on the second anode layer 522, and the first anode layer 521 is electrically connected to the first electrode layer 11.

In the undercut structure A, the cathode layer 51 is connected in parallel with the first electrode layer 11 and the second electrode layer 4, thereby reducing the impedance of the cathode layer 51, preventing a significant voltage drop, and alleviating the problem of uneven display brightness caused by the high impedance of the cathode layer 51. Moreover, by setting a second electrode layer 4 on the flat layer 3, the electrode layer can be flattened to cover the protruding foreign objects on the flat layer 3. The luminescent functional layer 5 is directly connected to the second electrode layer 4 to avoid the protruding foreign objects on the flat layer 3 causing dark spots. By using auxiliary capacitors, the charging and discharging capabilities can be enhanced and the display effect can be improved.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A display panel, comprising:

an array substrate, comprising a first electrode layer;

a passivation layer, located on the array substrate, wherein a first hole corresponding to a resistance improvement area is defined in the passivation layer;

a flat layer, located on the passivation layer, wherein a second hole corresponding to the resistance improvement area is defined in the flat layer;

a second electrode layer, located on the flat layer, wherein a third hole corresponding to the resistance improvement area is defined in the second electrode layer; and a luminescent functional layer, located on an area of the second electrode layer corresponding to a display area that is around the display area, the luminescent functional layer comprising a luminescent layer, a cathode layer, and an anode layer connected to the first electrode layer on the display area;

wherein the first hole, the second hole, and the third hole are connected, and a projection area of the first hole on the array substrate is greater than a projection area of the second hole on the array substrate;

wherein a portion of the first electrode layer on the resistance improvement area is located at a bottom of the first hole;

wherein the cathode layer is connected to the second electrode layer through the third hole, and connected to the first electrode layer on the resistance improvement area through the second hole and the first hole.

2. The display panel as claimed in claim 1, wherein the projection area of the second hole on the array substrate is greater than a projection area of the third hole on the array substrate.

3. The display panel as claimed in claim 1, wherein a concave notch on a side of the third hole is formed on the second electrode layer, and the cathode layer is connected to the second electrode layer through the concave notch.

4. The display panel as claimed in claim 1, further comprising:

a substrate;

a third electrode layer, located on the substrate; and a dielectric layer, located on the third electrode layer;

wherein the first electrode layer is located on the dielectric layer, and the first electrode layer located in the resistance improvement area is parallel to the third electrode layer.

5. The display panel as claimed in claim 4, further comprising a capacitance area located around the display area, wherein the first electrode layer and the second electrode layer located in the capacitance area form an auxiliary capacitor.

6. The display panel as claimed in claim 5, wherein the first electrode layer located in a capacitor area is in parallel with the third electrode layer.

7. The display panel as claimed in claim 1, further comprising a packaging area located on a side of the resistance improvement area far from the display area, and no flat layer is formed on the packaging area.

8. The display panel as claimed in claim 1, wherein the flat layer is not formed on a junction of the resistance improvement area and the display area.

9. The display panel as claimed in claim 1, wherein the anode layer comprises a first anode layer and a second anode layer, the first anode layer is located on the second electrode layer, the second anode layer is located on the first anode layer, the luminescent layer is located on the second anode layer, and the first anode layer is electrically connected to the first electrode layer.

10. The display panel as claimed in claim 1, wherein a thickness of the second electrode layer ranges from 50 Å to 200 Å.

11. A display panel, comprising:

an array substrate, comprising a first electrode layer;

a passivation layer, located on the array substrate, wherein a first hole corresponding to a resistance improvement area is defined in the passivation layer;

a flat layer, located on the passivation layer, wherein a second hole corresponding to the resistance improvement area is defined in the flat layer;

a second electrode layer, located on the flat layer, wherein a third hole corresponding to the resistance improvement area is defined in the second electrode layer and a concave notch on a side of the third hole is formed on the second electrode layer; and a luminescent functional layer, located on an area of the second electrode layer corresponding to a display area that is around the display area, the luminescent functional layer comprising a luminescent layer, a cathode layer, and an anode layer connected to the first electrode layer on the display area;

wherein the cathode layer is connected to the first electrode layer on the resistance improvement area through the second hole and the first hole, and the cathode layer is connected to the second electrode layer through the third hole and the concave notch.

12. The display panel as claimed in claim 11, wherein a projection area of the second hole on the array substrate is greater than a projection area of the third hole on the array substrate.

13. The display panel as claimed in claim 11, wherein a projection area of the first hole on the array substrate is greater than a projection area of the second hole on the array substrate.

14. The display panel as claimed in claim 11, further comprising:

a substrate;

a third electrode layer, located on the substrate; and a dielectric layer, located on the third electrode layer;

wherein the first electrode layer is located on the dielectric layer, and the first electrode layer located in the resistance improvement area is parallel to the third electrode layer.

15. The display panel as claimed in claim 14, further comprising a capacitance area located around the display area, wherein the first electrode layer and the second electrode layer located in the capacitance area form an auxiliary capacitor.

16. The display panel as claimed in claim 15, wherein the first electrode layer located in a capacitor area is in parallel with the third electrode layer.

17. The display panel as claimed in claim 11, further comprising a packaging area located on a side of the resistance improvement area far from the display area, and no flat layer is formed on the packaging area.

18. The display panel as claimed in claim 11, wherein the flat layer is not formed on a junction of the resistance improvement area and the display area.

19. The display panel as claimed in claim 11, wherein the anode layer comprises a first anode layer and a second anode layer, the first anode layer is located on the second electrode layer, the second anode layer is located on the first anode layer, the luminescent layer is located on the second anode layer, and the first anode layer is electrically connected to the first electrode layer.

20. The display panel as claimed in claim 11, wherein a thickness of the second electrode layer ranges from 50 Å to 200 Å.

* * * * *